(12) United States Patent
Kato et al.

(10) Patent No.: US 10,837,448 B2
(45) Date of Patent: Nov. 17, 2020

(54) COUNTER-ROTATING AXIAL FLOW FAN

(71) Applicant: NIDEC SERVO CORPORATION, Kiryu (JP)

(72) Inventors: Yoshihiko Kato, Kiryu (JP); Takahiro Bamba, Kiryu (JP); Yoshihisa Kagawa, Kiryu (JP); Takanori Abe, Kiryu (JP)

(73) Assignee: NIDEC SERVO CORPORATION, Gunma (JP)

( * ) Notice: Subject to any disclaimer, the term of this patent is extended or adjusted under 35 U.S.C. 154(b) by 55 days.

(21) Appl. No.: 16/354,216

(22) Filed: Mar. 15, 2019

(65) Prior Publication Data

US 2019/0301473 A1 Oct. 3, 2019

(30) Foreign Application Priority Data

Mar. 30, 2018 (JP) .................. 2018-069759
Jan. 21, 2019 (JP) .................. 2019-007881

(51) Int. Cl.
| | |
|---|---|
| *F04D 19/02* | (2006.01) |
| *F04D 19/00* | (2006.01) |
| *F04D 25/08* | (2006.01) |
| *F04D 29/52* | (2006.01) |
| *H02K 7/14* | (2006.01) |
| *H05K 7/20* | (2006.01) |

(52) U.S. Cl.
CPC ......... *F04D 19/024* (2013.01); *F04D 19/002* (2013.01); *F04D 25/08* (2013.01); *F04D 29/522* (2013.01); *H02K 7/14* (2013.01); *H05K 7/20172* (2013.01)

(58) Field of Classification Search
CPC .... F04D 19/002; F04D 19/007; F04D 19/024; F04D 25/08; F04D 29/522; H02K 16/00; H02K 7/14; H02K 21/22; H02K 7/20172; H02K 2213/03
See application file for complete search history.

(56) References Cited

U.S. PATENT DOCUMENTS

| | | | |
|---|---|---|---|
| 7,946,804 B2 | 5/2011 | Yoshida | |
| 8,007,234 B2* | 8/2011 | Yoshida | ............... F04D 19/007 415/220 |
| 8,079,801 B2* | 12/2011 | Yoshida | .............. F04D 25/0613 415/199.5 |
| 8,172,501 B2* | 5/2012 | Nishizawa | ............ F04D 29/522 415/68 |

(Continued)

*Primary Examiner* — Igor Kershteyn
(74) *Attorney, Agent, or Firm* — Keating & Bennett (57) ABSTRACT

A counter-rotating axial flow fan includes a first fan including a first impeller including first blades radially arranged around a predetermined central axis, a first motor rotating the first impeller around the central axis, and a first case surrounding an outer periphery of the first impeller, and a second fan including a second impeller including second blades radially arranged around the central axis, a second motor rotating the second impeller around the central axis, and a second case surrounding an outer periphery of the second impeller. End surfaces of the first and second cases contact each other at a first position in an axial direction, the first and second motors face in opposite directions from each other in the axial direction, and end surfaces of the first and second motors are opposite to each other at a second position that differs from the first position.

10 Claims, 5 Drawing Sheets

(56) References Cited

U.S. PATENT DOCUMENTS

| | | | |
|---|---|---|---|
| 2005/0106026 A1* | 5/2005 | Oosawa | F04D 29/646 416/198 R |
| 2007/0059155 A1* | 3/2007 | Ishihara | F04D 19/024 415/60 |
| 2008/0260526 A1* | 10/2008 | Nishizawa | F04D 25/0613 415/199.4 |
| 2009/0040714 A1* | 2/2009 | Yamada | H05K 7/20172 361/679.48 |
| 2010/0033041 A1* | 2/2010 | Watanabe | F04D 25/0613 310/63 |
| 2011/0142611 A1* | 6/2011 | Kato | F04D 29/544 415/206 |
| 2012/0257957 A1* | 10/2012 | Yanagisawa | F04D 19/024 415/61 |

* cited by examiner

Fig.5

COUNTER-ROTATING AXIAL FLOW FAN

CROSS REFERENCE TO RELATED APPLICATIONS

This application claims the benefit of priority to Japanese Patent Application No. 2018-069759 filed on Mar. 30, 2018 and Japanese Patent Application No. 2019-007881 filed on Jan. 21, 2019. The entire contents of these applications are hereby incorporated herein by reference.

1. Field of the Disclosure

The present disclosure relates to a counter-rotating axial flow fan.

2. Background

Known cooling fans for cooling electronic parts inside housings have been conventionally used in electronic devices such as a personal computer, a server, or the like. As one of such cooling fans, a serial type axial flow fan in which two axial flow type air blower units are connected in series along a predetermined central axis is known. This serial type axial flow fan is configured by arranging two impellers rotating in mutually opposite directions in a central axis direction.

In a relatively large electronic device such as the server, the cooling fan having a larger air volume is required. A new technique that can obtain the larger air volume has been desired to be provided even in a counter-rotating axial flow fan that is one type of the serial type axial flow fan described above.

SUMMARY

A counter-rotating axial flow fan according to an example embodiment of the present disclosure includes a first fan including a first impeller including a plurality of first blades radially arranged around a predetermined central axis, a first motor rotating the first impeller around the central axis, and a first case surrounding an outer periphery of the first impeller, and a second fan including a second impeller including a plurality of second blades radially arranged around the central axis, a second motor rotating the second impeller around the central axis, and a second case surrounding an outer periphery of the second impeller. End surfaces of the first case and the second case are in contact with each other at a first position in an axial direction, the first motor and the second motor face in opposite directions from each other in the axial direction, and end surfaces of the first motor and the second motor are opposite to each other at a second position that differs from the first position.

Another counter-rotating axial flow fan according to an example embodiment of the present disclosure includes a first fan including a first impeller including a plurality of first blades radially arranged around a predetermined central axis, a first motor rotating the first impeller around the central axis, and a first case surrounding an outer periphery of the first impeller, a second fan including a second impeller including a plurality of second blades radially arranged around the central axis, a second motor rotating the second impeller around the central axis, and a second case surrounding an outer periphery of the second impeller, a plurality of first supports radially extending around the central axis to be connected to the first case and supporting a second motor side of the first motor, and a plurality of second supports radially extending around the central axis to be connected to the second case and supporting a first motor side of the second motor. End surfaces of the first case and the second case are in contact with each other, the first motor and the second motor are arranged to face in opposite directions from each other in an axial direction, and sectional areas along the axial direction of each of the first supports and each of the second supports are equal or substantially equal to each other.

Another counter-rotating axial flow fan according to an example embodiment of the present disclosure includes a first fan including a first impeller including a plurality of first blades radially arranged around a predetermined central axis, a first motor rotating the first impeller around the central axis, and a first case surrounding an outer periphery of the first impeller, a second fan including a second impeller including a plurality of second blades radially arranged around the central axis, a second motor rotating the second impeller around the central axis, and a second case surrounding an outer periphery of the second impeller, a plurality of first supports radially extending around the central axis to be connected to the first case and supporting a second motor side of the first motor, and a plurality of second supports radially extending around the central axis to be connected to the second case and supporting a first motor side of the second motor. Each of the first supports extends toward the first motor from an inner circumferential surface of the first case to one side in an axial direction, and each of the second supports extends toward the second motor from an inner circumferential surface of the second case to the one side in the axial direction.

The above and other elements, features, steps, characteristics and advantages of the present disclosure will become more apparent from the following detailed description of example embodiments with reference to the attached drawings.

DETAILED DESCRIPTION

Example embodiments of the present disclosure will be described with reference to the drawings hereinafter. Incidentally, scope of the present disclosure is not limited to the example embodiments described below, and the present disclosure includes any modification thereof within the scope of the technical idea of the present disclosure.

Scale, the number, and so on in each configuration illustrated in the following drawings are sometimes different from those of an actual configuration in order to make each configuration easy to be understood. In each figure, a Z axis is appropriately shown. A Z-axis direction in each figure is a direction parallel to an axial direction of a central axis J shown in FIG. 1. In the following description, a positive side in the Z-axis direction (+Z side, one side) is referred to as "intake side", a negative side in the Z-axis direction (−Z side, the other side) is referred to as "exhaust side". The above definitions of the intake side and the exhaust side are made simply for the sake of convenience in description, and are not meant to restrict actual position relation or direction. Also, unless otherwise explained, a direction (Z-axis direction) parallel to the central axis J is simply referred to as "axial direction", a radial direction around the central axis J is simply referred to as "radial direction", and a circumferential direction around the central axis J, that is, a direction along a circumference of the central axis J, is simply referred to as "circumferential direction". Further, in the following description, "in plan view" means a state viewed from an axial direction.

A counter-rotating axial flow fan 100 of the present example embodiment is used, for example, as an electric cooling fan for air-cooling electronic equipment such as a server.

Figure 1:
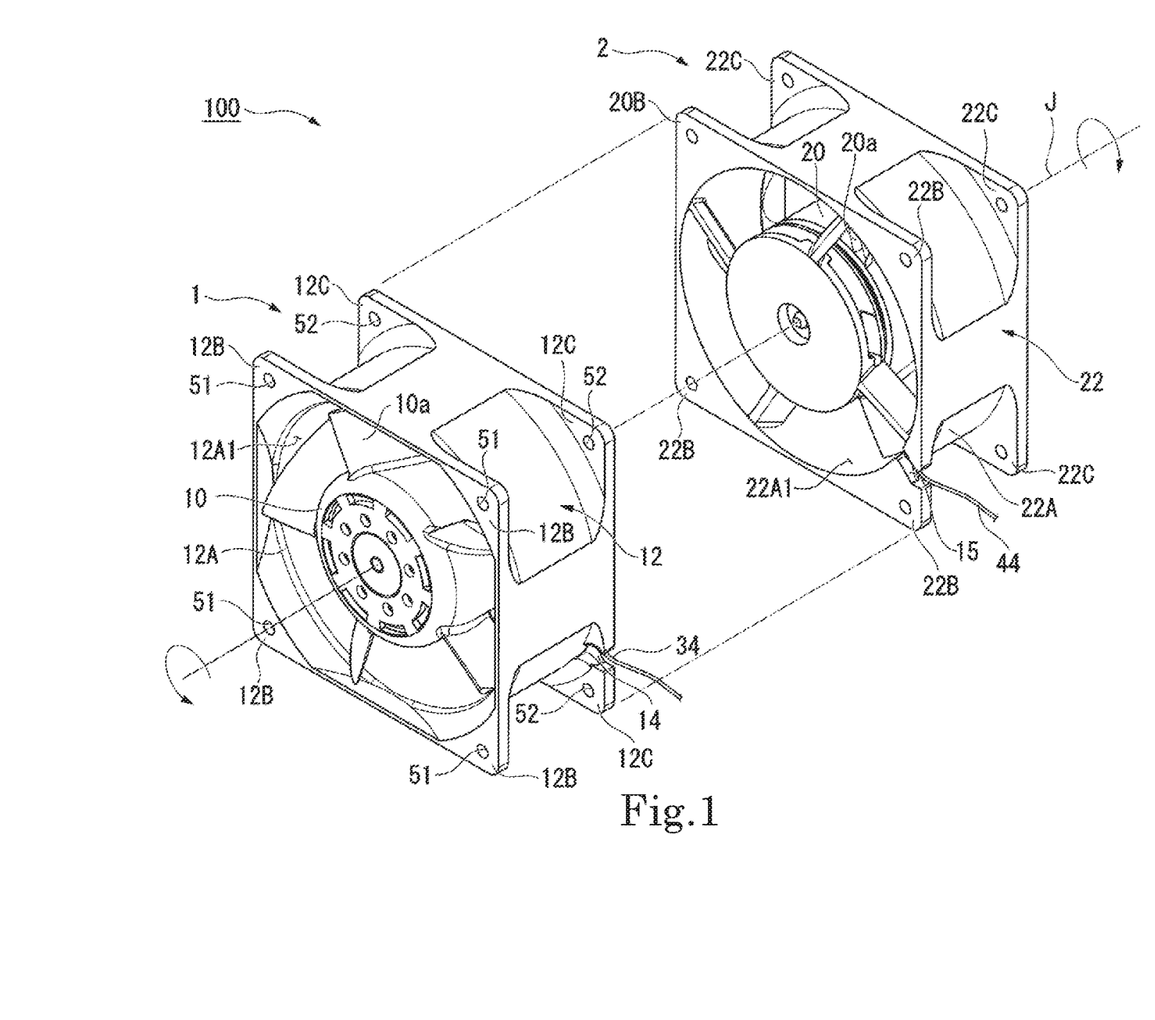
FIG. 1 is an exploded perspective view of a counter-rotating axial flow fan of an example embodiment of the present disclosure.
Figure 2A:
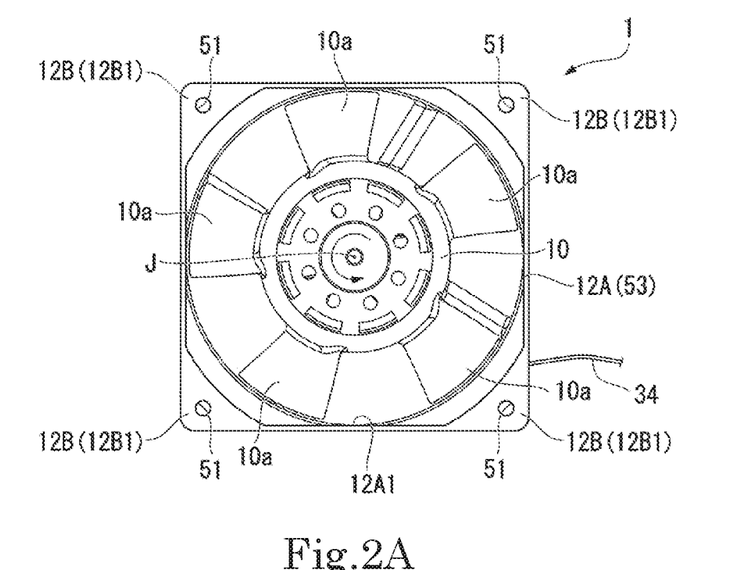
FIG. 2A is a plan view of a first axial flow fan as viewed from an intake side.
Figure 2B:
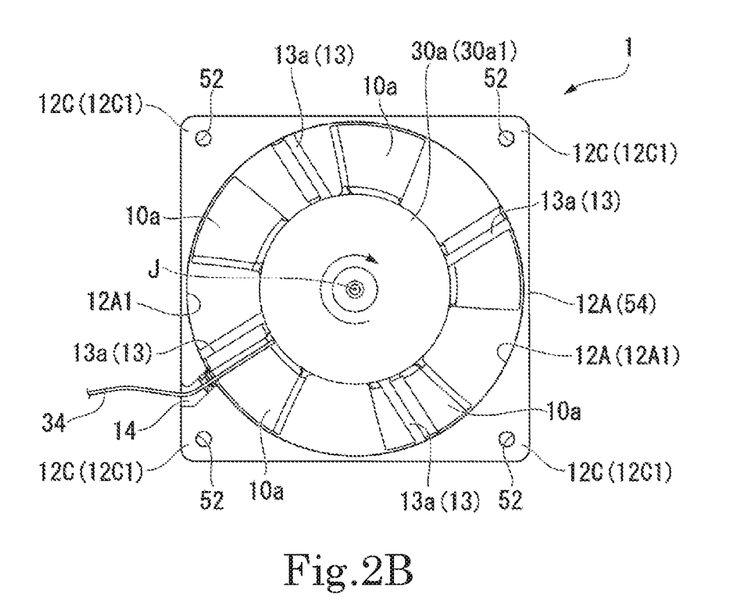
FIG. 2B is a plan view of the first axial flow fan as viewed from an exhaust side.
Figure 3A:
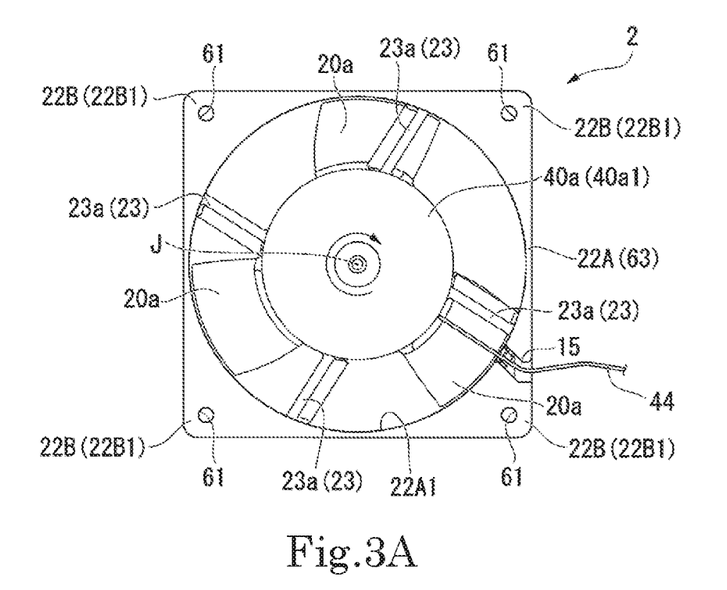
FIG. 3A is a plan view of a second axial flow fan as viewed from the intake side.
Figure 3B:
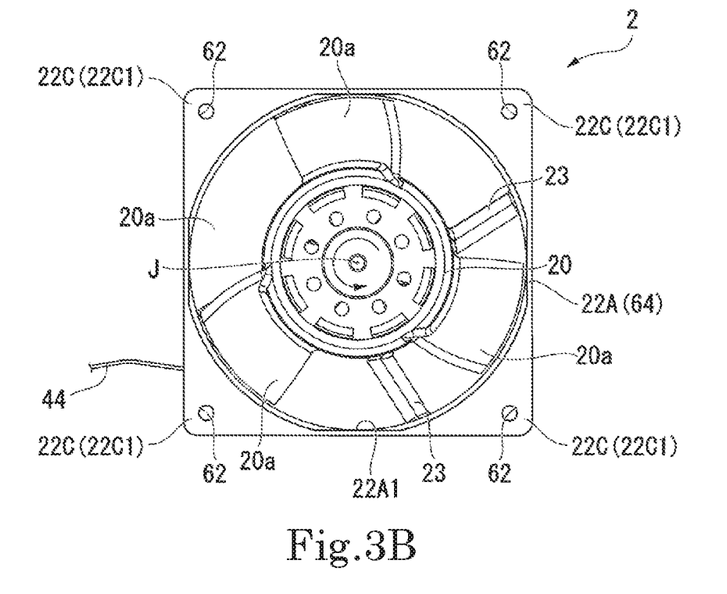
FIG. 3B is a plan view of the second axial flow fan as viewed from the exhaust side.
Figure 4:
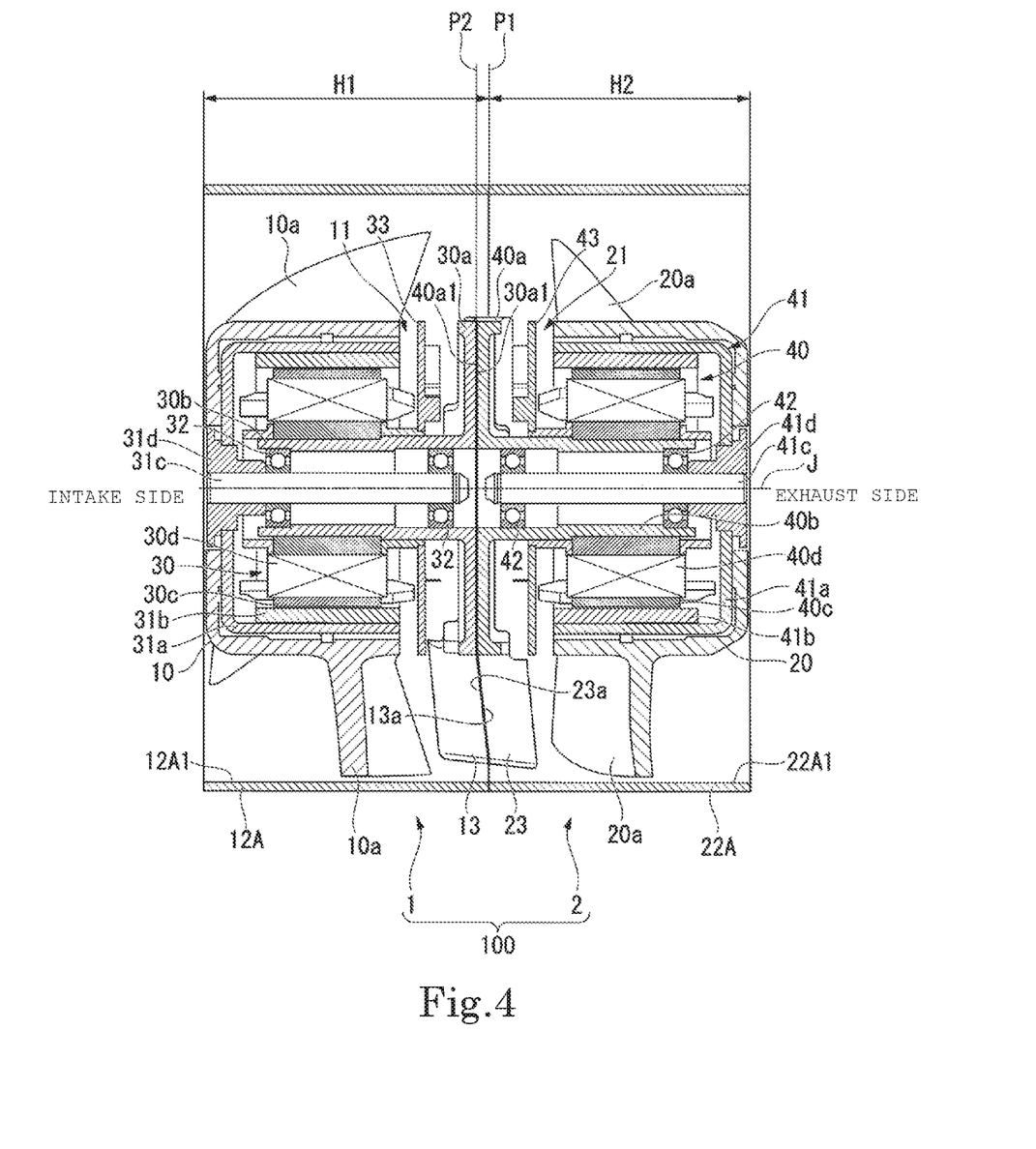
FIG. 4 is a sectional view of a counter-rotating axial flow fan of an example embodiment of the present disclosure.

FIG. 1 is an exploded perspective view of the counter-rotating axial flow fan of the present example embodiment. FIG. 2A is a plan view of a first axial flow fan as viewed from an intake side, and FIG. 2B is a plan view of the first axial flow fan as viewed from an exhaust side. FIG. 3A is a plan view of a second axial flow fan as viewed from the intake side, and FIG. 3B is a plan view of the second axial flow fan as viewed from the exhaust side. FIG. 4 is a sectional view of the counter-rotating axial flow fan of the present example embodiment.

As shown in FIG. 1, the counter-rotating axial flow fan 100 includes a first axial flow fan (first fan) 1 and a second axial flow fan (second fan) 2. In the counter-rotating axial flow fan 100, the first axial flow fan 1 is arranged on an intake side that is one side in an axial direction, and the second axial flow fan 2 is arranged on an exhaust side that is the other side in the axial direction. In the present example embodiment, the first axial flow fan 1 and the second axial flow fan 2 are arranged from the one side in the axial direction toward the other side in the axial direction in order.

In the counter-rotating axial flow fan 100, a first impeller 10 of the first axial flow fan 1 and a second impeller 20 of the second axial flow fan 2 rotate in mutually opposite directions, whereby air is taken in from a left side in FIG. 1 (that is, the first axial flow fan 1 side) and is delivered to a right side (that is, the second axial flow fan 2 side) to generate an air flow in a direction of the central axis J.

In the counter-rotating axial flow fan 100, by setting a rotation direction of the first impeller 10 and a rotation direction of the second impeller 20 in the opposite directions, high static pressure and larger air volume are realizable compared with a serial type axial flow fan in which two impellers rotate in the same direction.

As shown in FIG. 2A, FIG. 2B and FIG. 4, the first axial flow fan 1 includes the first impeller 10, a first motor unit 11, a first case 12, and a plurality of first support ribs (first support members) 13. As shown in FIG. 3A, FIG. 3B, and FIG. 4, the second axial flow fan 2 includes the second impeller 20, a second motor unit 21, a second case 22, and a plurality of second support ribs (second support members) 23.

The first impeller 10 has a plurality (five in the present example embodiment) of first blades 10a radially arranged at equal pitches around the central axis J. The first impeller 10 rotates around the central axis J by the first motor unit 11 in a predetermined direction (an arrow direction shown in each of FIG. 2A and FIG. 2B). The number of the first blades 10a in the first impeller 10 is not limited to the above described.

The second impeller 20 has a plurality (three in the present example embodiment) of second blades 20a radially arranged at equal pitches around the central axis J. The second impeller 20 rotates around the central axis J by the second motor unit 21 in a direction opposite to that of the first impeller 10 (an arrow direction shown in each of FIG. 3A and FIG. 3B). As a result, the second impeller 20 generates an air flow in the same direction as the air flow by the first impeller 10 (that is, the air flow in the direction of the central axis J from the left side to the right side in FIG. 1). The number of the second blades 20a in the second impeller 20 is not limited to the above described.

The first case 12 surrounds an outer periphery (radial outside) of the first impeller 10. In the present example embodiment, the first case 12 is constituted by, for example, an aluminum die casting. The first case 12 has a tubular circumferential wall portion 12A extending in the axial direction, four intake side flange portions 12B provided on the intake side in the axial direction of the circumferential wall portion 12A and projecting radially outside, and four exhaust side flange portions 12C provided on the exhaust side in the axial direction of the circumferential wall portion 12A and projecting radially outside.

In the first case 12, an inner circumferential surface 12A1 formed of a cylindrical surface in the circumferential wall portion 12A constitutes a wind tunnel. As shown in FIG. 2A, an intake side end surface 53 of the circumferential wall portion 12A in the axial direction is flush with a surface 12B1 of each of the intake side flange portions 12B.

As shown in FIG. 2B, an exhaust side end surface 54 of the circumferential wall portion 12A in the axial direction is flush with a surface 12C1 of each of the exhaust side flange portions 12C. A first notch 14 is provided on one of the four exhaust side flange portions 12C. The first notch 14 is provided in a state in which the first notch 14 penetrates a part of the circumferential wall portion 12A.

As shown in FIG. 2A and FIG. 2B, as viewed from the axial direction, an outline shape of the first case 12 is a substantial quadrangle. Four corners in the quadrilateral outline shape are constituted by the outlines of the intake side flange portions 12B and the exhaust side flange portions 12C. Through holes 51, 52 penetrating in the axial direction are respectively provided in the intake side flange portions 12B and the exhaust side flange portions 12C. Fastening screws used for fixing with the second axial flow fan 2 are attached to the through holes 51, 52.

As shown in FIG. 2B, the plurality of first support ribs 13 (four in the present example embodiment) radially extend around the central axis J to be connected to the first case 12 and support the second motor unit 21 side of the first motor unit 11. Each of the first support ribs 13 is connected to the exhaust side of the inner circumferential surface 12A1 in the circumferential wall portion 12A of the first case 12 and supports a radial outside of the first motor unit 11. A configuration of the first motor unit 11 will be described later.

The second case 22 surrounds an outer periphery (radial outside) of the second impeller 20. In the present example embodiment, the second case 22 has a tubular circumferential wall portion 22A extending in the axial direction, four intake side flange portions 22B provided on the intake side in the axial direction of the circumferential wall portion 22A and projecting radially outside, and four exhaust side flange portions 22C provided on the exhaust side in the axial direction of the circumferential wall portion 22A and projecting radially outside.

In the second case 22, an inner circumferential surface 22A1 formed of a cylindrical surface in the circumferential wall portion 22A constitutes a wind tunnel. As shown in FIG. 3A, an intake side end surface 63 in the axial direction of the circumferential wall portion 22A is flush with a surface 22B1 of each of the intake side flange portions 22B. A second notch 15 is provided on one of the four intake side flange portions 22B. The second notch 15 is provided in a state in which the second notch 15 penetrates a part of the circumferential wall portion 22A. A shape of the second notch 15 is the same as a shape of the first notch 14.

As shown in FIG. 3B, an exhaust side end surface 64 of the circumferential wall portion 22A in the axial direction is flush with a surface 22C1 of each of the exhaust side flange portions 22C.

As shown in FIG. 3A and FIG. 3B, as viewed from the axial direction, an outline shape of the second case 22 is a substantial quadrangle. Four corners in the quadrilateral outline shape are constituted by the outlines of the intake side flange portions 22B and the exhaust side flange portions 22C. Through holes 61, 62 penetrating in the axial direction are respectively provided in the intake side flange portions 22B and the exhaust side flange portions 22C. Fastening screws used for fixing with the first axial flow fan 1 are attached to the through holes 61, 62. By inserting the fastening screws not shown through the through holes 51, 52 of the first axial flow fan 1 and the through holes 61, 62 of the second axial flow fan 2, the first axial flow fan 1 and the second axial flow fan 2 are integrally fixed to each other to constitute the counter-rotating axial flow fan 100 (see FIG. 1).

The plurality of second support ribs 23 (four in the present example embodiment) radially extend around the central axis J to be connected to the second case 22 and support the first motor unit 11 side of the second motor unit 21. Specifically, each of the second support ribs 23 is located on the intake side of the inner circumferential surface 22A1 in the circumferential wall portion 22A of the second case 22 and supports a radial outside of the second motor unit 21. A configuration of the second motor unit 21 will be described later.

The first case 12 and the second case 22 are arranged in a state where the first notch 14 of the exhaust side flange portion 12C in the first case 12 and the second notch 15 of the intake side flange portion 22B in the second case 22 are aligned (see FIG. 1). In the present example embodiment, the first notch 14 and the second notch 15 have the same shape. Thus, when viewed from the axial direction, the first notch 14 and the second notch 15 are superimposed on each other in a planar manner. As described above, according to the counter-rotating axial flow fan 100 of the present example embodiment, the first notch 14 and the second notch 15 are used for aligning the first axial flow fan 1 (the first case 12) and the second axial flow fan 2 (the second case 22) to improve assemblability.

As shown in FIG. 4, in the counter-rotating axial flow fan 100 of the present example embodiment, the first motor unit 11 and the second motor unit 21 are outer rotor type motors. The first motor unit 11 includes a stator portion 30, a rotor portion 31, bearings 32, and a first circuit board 33. The stator portion 30 has a substantially annular base part 30a centering the central axis J, a substantially cylindrical bearing holding part 30b projecting toward the intake side of the base part 30a, a stator core 30c attached to a radial outside of the bearing holding part 30b, and coils 30d mounted on the stator core 30c. The coils 30d are provided on the stator core 30c via an insulator.

As shown in FIG. 2B, each of the first support ribs 13 radially extends from the base part 30a and is connected to the inner circumferential surface 12A1 in the circumferential wall portion 12A of the first case 12. In the present example embodiment, the base part 30a and the bearing holding part 30b are made of the same aluminum as the first case 12. The base part 30a and the bearing holding part 30b are integrally formed together with the plurality of first support ribs 13 and the first case 12 by the aluminum die casting. Two bearings 32, which are a part of a bearing mechanism, are provided inside the bearing holding part 30b in the axial direction.

The first circuit board 33 is held by inserting the bearing holding part 30b of the stator portion 30 thereinto. The first circuit board 33 has a substantially annular plate shape and is electrically connected to a lead wire (not shown) drawn out from the coils 30d of the stator portion 30 to control rotation of the stator portion 30. On the first circuit board 33, for example, an integrated circuit and a capacitor (not shown) are mounted. From the first circuit board 33, a first wiring 34 (see FIG. 1, FIG. 2B) in which a plurality of lead wires are bundled is drawn out. The first circuit board 33 is connected to an external device (not shown) such as a power supply provided outside the counter-rotating axial flow fan 100 via the first wiring 34.

As shown in FIG. 1 and FIG. 2B, the first wiring 34 drawn out from the first circuit board 33 is held by the first notch 14 provided in the exhaust side flange portion 12C and is drawn outside the first case 12.

The rotor portion 31 is rotatably supported with respect to the stator portion 30 around the central axis J via the bearings 32. The rotor portion 31 includes a core 31a made of a metal having magnetism and having a substantially closed lid cylindrical shape centering the central axis J, a substantially cylindrical magnet 31b fixed to an inside of a side wall of the core 31a (that is, an inside surface) to be opposite to the coils 30d of the stator portion 30, a shaft 31c projecting to the one side in the axial direction from a lid part of the core 31a, and a bush 31d.

The shaft 31c is inserted into the bearing holding part 30b and rotatably supported by the bearings 32. In the rotor portion 31, the core 31a and the shaft 31c are integrally held via the bush 31d. The first impeller 10 is fixed to the rotor portion via the bush 31d. As a result, the first impeller 10 is rotatable together with the rotor portion 31.

As shown in FIG. 4, the second motor unit 21 has the same structure as the first motor unit 11. The second motor unit 21 includes a stator portion 40, a rotor portion 41, bearings 42, and a second circuit board 43. The stator portion 40 has a substantially annular base part 40a centering the central axis J, a substantially cylindrical bearing holding part 40b projecting toward the intake side of the base part 40a, a stator core 40c attached to a radial outside of the bearing holding part 40b, and coils 40d mounted on the stator core 40c. The coils 40d are provided on the stator core 40c via an insulator.

The rotor portion 41 is rotatably supported with respect to the stator portion 40 around the central axis J via the bearings 42. The rotor portion 41 includes a core 41a made of a metal having the magnetism and having a substantially closed lid cylindrical shape centering the central axis J, a substantially cylindrical magnet 41b fixed to an inside of a side wall of the core 41a (that is, an inside surface) to be opposite to the coils 40d of the stator portion 40, a shaft 41c projecting to the one side in the axial direction from a lid part of the core 41a, and a bush 41d.

The shaft 41c is inserted into the bearing holding part 40b and rotatably supported by the bearings 42. In the rotor portion 41, the core 41a and the shaft 41c are integrally held via the bush 41d. The second impeller 20 is fixed to the rotor portion 41 via the bush 41d. As a result, the second impeller 20 is rotatable together with the rotor portion 41.

Each of the second support ribs 23 radially extends from the base part 40a and is connected to the inner circumferential surface 22A1 in the circumferential wall portion 22A of the second case 22. In the present example embodiment, the base part 40a and the bearing holding part 40b are made of the same aluminum as the second case 22. The base part 40a and the bearing holding part 40b are integrally formed together with the plurality of second support ribs 23 and the second case 22 by the aluminum die casting. Two bearings 42, which are a part of a bearing mechanism, are provided inside the bearing holding part 40b in the axial direction.

The second circuit board 43 is held by inserting the bearing holding part 40b of the stator portion 40 thereinto. The second circuit board 43 has a substantially annular plate shape and is electrically connected to a lead wire (not shown) drawn out from the coils 40d of the stator portion 40 to control rotation of the stator portion 40. On the second circuit board 43, for example, an integrated circuit and a capacitor (not shown) are mounted. From the second circuit board 43, a second wiring 44 (see FIG. 1, FIG. 3A) in which a plurality of lead wires are bundled is drawn out. The second circuit board 43 is connected to the external device (not shown) such as the power supply provided outside the counter-rotating axial flow fan 100 via the second wiring 44.

As shown in FIG. 1 and FIG. 3A, the second wiring 44 drawn out from the second circuit board 43 is drawn outside the second case 22 via the second notch 15 provided in the intake side flange portion 22B.

In the present example embodiment, the first notch 14 and the second notch 15 are superimposed on each other in the planar manner when viewed from the axial direction. That is, a drawing direction of the first wiring 34 from the first circuit board 33 is the same as a drawing direction of the second wiring 44 from the second circuit board 43. According to the counter-rotating axial flow fan 100 of the present example embodiment, by making the drawing directions of the first wiring 34 and the second wiring 44 the same, the first wiring 34 and the second wiring 44 are easily routed to the external device.

The rotor portion 41 is rotatably supported with respect to the stator portion 40 around the central axis J via the bearings 42. The rotor portion 41 includes the core 41a made of the metal having the magnetism and having the substantially closed lid cylindrical shape centering the central axis J, the substantially cylindrical magnet 41b fixed to the inside of the side wall of the core 41a (that is, the inside surface) to be opposite to the coils 40d of the stator portion 40, and the shaft 41c projecting to the one side in the axial direction from the lid part of the core 41a. The shaft 41c is inserted into the bearing holding part 40b and rotatably supported by the bearings 42.

When the counter-rotating axial flow fan 100 according to the present example embodiment is viewed as a whole, the first case 12 of the first motor unit 11 and the second case 22 of the second motor unit 21 come into contact with each other in the axial direction. In the present example embodiment, the exhaust side end surface of the first case 12 and the intake side end surface of the second case 22 come into contact with each other in the axial direction. More specifically, the exhaust side end surface 54 of the circumferential wall portion 12A in the first case 12 and the intake side end surface 63 of the circumferential wall portion 22A in the second case 22 come into contact with each other in the axial direction. Further, the surface 12C1 (see FIG. 2B) of each of the exhaust side flange portions 12C in the first case 12 and the surface 22B1 (see FIG. 3A) of each of the intake side flange portions 22B in the second case 22 come into contact with each other in the axial direction. As a result, the first case 12 and the second case 22 are brought into contact with each other without any gap in the axial direction.

A position where the first case 12 and the second case are in contact with each other in the axial direction is referred to as a first position P1. In the present example embodiment, the end surfaces of the first case 12 and the second case 22 are brought into contact with each other at the first position P1 in the axial direction.

In the present example embodiment, an axial length H1 of the first case 12 is longer than an axial length H2 of the second case 22. Thus, a distance in the axial direction of the wind tunnel constituted by the first case 12 is longer than a distance in the axial direction of the wind tunnel constituted by the second case 22. According to the present example embodiment, an axial length of each of the first blades 10a of the first impeller 10 accommodated in the first case 12 may be set longer than an axial length of each of the second blades 20a of the second impeller 20 accommodated in the second case 22.

In the first axial flow fan 1 and the second axial flow fan 2, an end surface located at the exhaust side in the axial direction of the first motor unit 11 and an end surface located at the intake side in the axial direction of the second motor unit 21 are opposite to each other in the axial direction.

Specifically, the first motor unit 11 and the second motor unit 21 are arranged in a state in which a surface 30a1 opposite to the bearing holding part 30b in the base part 30a and a surface 40a1 opposite to the bearing holding part 40b in the base part 40a are close to each other. That is, a gap is formed between the surface 30a1 and the surface 40a1.

A position where the first motor unit 11 and the second motor unit 21 are opposite to each other in the axial direction is referred to as a second position P2. In the present example embodiment, the first motor unit 11 and the second motor unit 21 are disposed so as to face in opposite directions each other in the axial direction, and at the second position P2 that differs from the first position P1, the mutual end surfaces (the surface 30a1 and the surface 40a1) are opposite to each other. In the present example embodiment, since the gap is formed between the surface 30a1 and the surface 40a1, the second position P2 corresponds to a center position in the axial direction of the gap.

Specifically, the second position P2 is located on the one side in the axial direction (intake side) with respect to the first position P1. In the present example embodiment, since the first motor unit 11 and the second motor unit 21 have the same configuration, axial dimensions of the first motor unit 11 and the second motor unit 21 are the same.

In the present example embodiment, each of the first support ribs 13 extends toward the base part 30a from the inner circumferential surface 12A1 in the circumferential wall portion 12A of the first case 12 to the one side in the axial direction (intake side). Each of the first support ribs 13 has a connection surface 13a (see FIG. 2B, FIG. 4) that connects the first motor unit 11 (base part 30a) and the first case 12 (the inner circumferential surface 12A1 of the circumferential wall portion 12A). More specifically, each of the connection surfaces 13a connects an end surface 12A2 of the other side in the axial direction (exhaust side) of the circumferential wall portion 12A and the surface 30a1 opposite to the bearing holding part 30b in the base part 30a. Each of the connection surfaces 13a is an inclined surface that is inclined to the one side in the axial direction (intake side) from the inner circumferential surface 12A1 toward the base part 30a. In the counter-rotating axial flow fan 100 of the present example embodiment, the first axial flow fan 1 is in a state where the first motor unit 11 is recessed toward the one side in the axial direction (intake side) with respect to the first case 12 by the first support ribs 13.

In the present example embodiment, each of the second support ribs 23 extends toward the base part 40a from the inner circumferential surface 22A1 in the circumferential wall portion 22A of the second case 22 to the one side in the axial direction (intake side). Each of the second support ribs 23 has a connection surface 23a (see FIG. 3A, FIG. 4) that connects the second motor unit 21 (base part 40a) and the second case 22 (the inner circumferential surface 22A1 of the circumferential wall portion 22A). More specifically, each of the connection surfaces 23a connects an end surface 22A2 of the one side in the axial direction (intake side) of the circumferential wall portion 22A and the surface 40a1 opposite to the bearing holding part 40b in the base part 40a. Each of the connection surfaces 23a is an inclined surface that is inclined toward the base part 40a from the inner circumferential surface 22A1 to the one side in the axial direction (intake side). In the counter-rotating axial flow fan 100 of the present example embodiment, the second axial flow fan 2 is in a state where the second motor unit 21 is projected to the one side in the axial direction (intake side) with respect to the second case 22 by the second support ribs 23.

The counter-rotating axial flow fan 100 of the present example embodiment includes: the first axial flow fan (first fan) 1 having the first impeller 10 having the plurality of first blades 10a radially arranged around the predetermined central axis J, the first motor unit 11 rotating the first impeller 10 around the central axis J, and the first case 12 surrounding the outer periphery of the first impeller 10; the second axial flow fan (second fan) 2 having the second impeller 20 having the plurality of second blades 20a radially arranged around the central axis J, the second motor unit 21 rotating the second impeller 20 around the central axis J, and the second case 22 surrounding the outer periphery of the second impeller 20; the plurality of first support ribs (first support members) 13 radially extending around the central axis J to be connected to the first case 12 and supporting the second motor unit 21 side of the first motor unit 11; and the plurality of second support ribs (second support members) 23 radially extending around the central axis J to be connected to the second case 22 and supporting the first motor unit 11 side of the second motor unit 21. Each of the first support ribs 13 extends toward the first motor unit 11 from the inner circumferential surface 12A1 of the first case 12 to the one side in the axial direction and each of the second support ribs 23 extends toward the second motor unit 21 from the inner circumferential surface 22A1 of the second case 22 to the one side in the axial direction.

According to the counter-rotating axial flow fan 100 of the present example embodiment, by providing the first support ribs 13 and the second support ribs 23 extending to the one side in the axial direction (intake side), the configuration in which the axial length H1 of the first case 12 is made longer than the axial length H2 of the second case 22 as described above is realizable. As a result, the distance in the axial direction of the wind tunnel constituted by the first case 12 is extended more than the distance in the axial direction of the wind tunnel constituted by the second case 22, so that a configuration in which the axial length of each of the first blades 10a of the first impeller 10 accommodated in the first case 12 is set longer than the axial length of each of the second blades 20a of the second impeller 20 accommodated in the second case 22 is realizable.

Figure 5:
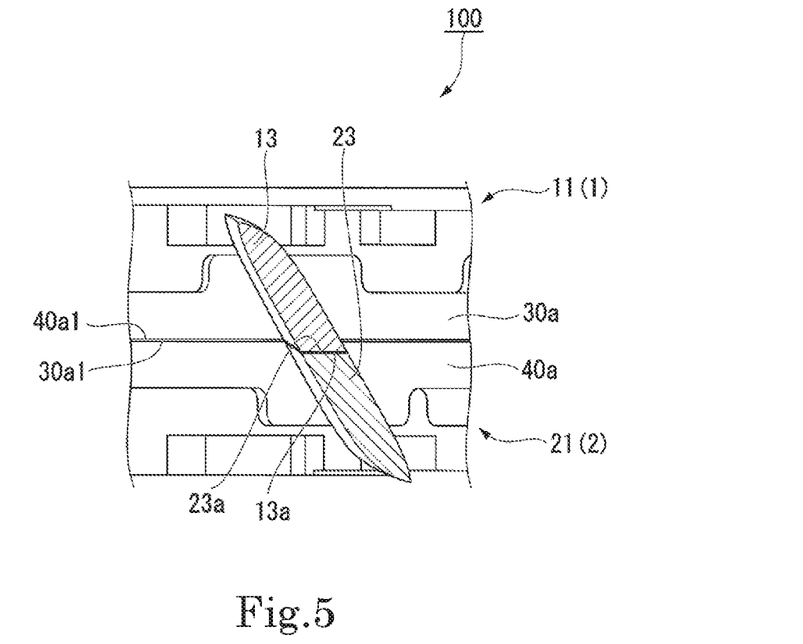
FIG. 5 is an enlarged sectional view of a main portion along an axial direction of the counter-rotating axial flow fan.

FIG. 5 is an enlarged sectional view of a main part along the axial direction of the counter-rotating axial flow fan. As shown in FIG. 5, each of the first support ribs 13 and each of the second support ribs 23 have the same sectional area along the axial direction. In the counter-rotating axial flow fan 100 of the present example embodiment, each of the first support ribs 13 and each of the second support ribs 23 have the same sectional area along the axial direction.

The counter-rotating axial flow fan 100 of the present example embodiment includes: the first axial flow fan (first fan) 1 having the first impeller 10 having the plurality of first blades 10a radially arranged around the predetermined central axis J, the first motor unit 11 rotating the first impeller 10 around the central axis J, and the first case 12 surrounding the outer periphery of the first impeller 10; the second axial flow fan (second fan) 2 having the second impeller 20 having the plurality of second blades 20a radially arranged around the central axis J, the second motor unit 21 rotating the second impeller 20 around the central axis J, and the second case 22 surrounding the outer periphery of the second impeller 20; the plurality of first support ribs (first support members) 13 radially extending around the central axis J to be connected to the first case 12 and supporting the second motor unit 21 side of the first motor unit 11; and the plurality of second support ribs (second support members) 23 radially extending around the central axis J to be connected to the second case 22 and supporting the first motor unit 11 side of the second motor unit 21. The end surfaces of the first case 12 and the second case 22 are in contact with each other, the first motor unit 11 and the second motor unit 21 are arranged to face in the opposite directions each other in the axial direction, and the sectional areas along the axial direction of each of the first support ribs 13 and each of the second support ribs 23 are equal to each other.

In the counter-rotating axial flow fan 100 of the present example embodiment, by making the sectional areas along the axial direction of each of the first support ribs 13 and each of the second support ribs 23 equal to each other, when the first case 12 and the second case 22 are formed by die casting, occurrence of misrun of molten metal is reducible. Thus, high precision parts are provided as the first case 12 and the second case 22.

As described above, according to the counter-rotating axial flow fan 100 of the present example embodiment, since a case contact position (the first position P1) and a motor opposite position (the second position P2) are made be different from each other in the axial direction, common use of motor components is realizable while the size of the first impeller 10 disposed on the intake side is made large. Thus, since the first impeller 10 is designable so as to be larger than the second impeller 20 while commonalizing the motor is performed, the counter-rotating axial flow fan 100 that obtains a larger air volume is provided. In addition, cost reduction is achieved by commonalizing the motor components.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

For example, in the counter-rotating axial flow fan 100 of the above-described example embodiment, the first axial flow fan 1 is disposed on the intake side and the second axial flow fan 2 is disposed on the exhaust side. However, arrangement of the first axial flow fan 1 and the second axial flow fan 2 is not limited to the above. The first axial flow fan 1 may be disposed on the exhaust side and the second axial flow fan 2 may be disposed on the intake side.

According to this structure, a configuration in which a wind tunnel distance of the exhaust side is longer than a wind tunnel distance of the intake side is realizable while the motor units of two fans are commonalized. Thus, the counter-rotating axial flow fan having desired air volume characteristics is provided.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A counter-rotating axial flow fan comprising:
    a first fan including a first impeller including a plurality of first blades radially arranged around a predetermined central axis, a first motor rotating the first impeller around the central axis, and a first case surrounding an outer periphery of the first impeller; and
    a second fan including a second impeller including a plurality of second blades radially arranged around the central axis, a second motor rotating the second impeller around the central axis, and a second case surrounding an outer periphery of the second impeller; wherein
    the first fan and the second fan are arranged in order from a first side in an axial direction to a second side in the axial direction;
    end surfaces of the first case and the second case are in contact with each other at a first position in the axial direction;
    the first motor and the second motor face in opposite directions from each other in the axial direction; and
    end surfaces of the first motor and the second motor are opposite to each other at a second position that differs from the first position.

2. The counter-rotating axial flow fan according to claim 1, wherein
    an axial length of the first case is longer than an axial length of the second case; and
    the second position is located on the first side in the axial direction with respect to the first position.

3. The counter-rotating axial flow fan according to claim 1, wherein the first motor and the second motor have a same structure.

4. The counter-rotating axial flow fan according to claim 1, further comprising:
    a plurality of first supports radially extending around the central axis to be connected to the first case and supporting a second motor side of the first motor; and
    a plurality of second supports radially extending around the central axis to be connected to the second case and supporting a first motor side of the second motor.

5. The counter-rotating axial flow fan according to claim 4, wherein each of the first supports and each of the second supports have an equal or substantially equal sectional area along the axial direction.

6. The counter-rotating axial flow fan according to claim 4, wherein
    each of the first supports extends toward the first motor from an inner circumferential surface of the first case to the first side in the axial direction; and
    each of the second supports extends toward the second motor from an inner circumferential surface of the second case to the first side in the axial direction.

7. The counter-rotating axial flow fan according to claim 1, wherein
    the first motor further includes a first circuit board including a first wiring connected to an external device;
    the second motor further includes a second circuit board including a second wiring connected to the external device; and
    a drawing direction of the first wiring from the first circuit board is the same as a drawing direction of the second wiring from the second circuit board as viewed in the axial direction.

8. The counter-rotating axial flow fan according to claim 7, wherein
    the first case includes a first notch to hold and draw the first wiring to an outside of the first case; and
    the second case includes a second notch to hold and draw the second wiring to an outside of the second case.

9. A counter-rotating axial flow fan comprising:
    a first fan including a first impeller including a plurality of first blades radially arranged around a predetermined central axis, a first motor rotating the first impeller around the central axis, and a first case surrounding an outer periphery of the first impeller;
    a second fan including a second impeller including a plurality of second blades radially arranged around the central axis, a second motor rotating the second impeller around the central axis, and a second case surrounding an outer periphery of the second impeller;
    a plurality of first supports radially extending around the central axis to be connected to the first case and supporting a second motor side of the first motor; and
    a plurality of second supports radially extending around the central axis to be connected to the second case and supporting a first motor side of the second motor; wherein
    end surfaces of the first case and the second case are in contact with each other;
    the first motor and the second motor face in opposite directions from each other in an axial direction; and
    each of the first supports and each of the second supports have an equal or substantially equal sectional area along the axial direction.

10. A counter-rotating axial flow fan comprising:
    a first fan including a first impeller including a plurality of first blades radially arranged around a predetermined central axis, a first motor rotating the first impeller around the central axis, and a first case surrounding an outer periphery of the first impeller;
    a second fan including a second impeller including a plurality of second blades and radially arranged around the central axis, a second motor rotating the second impeller around the central axis, and a second case surrounding an outer periphery of the second impeller;

a plurality of first supports radially extending around the central axis to be connected to the first case and supporting a second motor side of the first motor; and a plurality of second supports radially extending around the central axis to be connected to the second case and supporting a first motor side of the second motor; wherein each of the first supports extends toward the first motor from an inner circumferential surface of the first case to a first side in an axial direction; and each of the second supports extends toward the second motor from an inner circumferential surface of the second case to the first side in the axial direction.

* * * * *